(12) United States Patent
Hollmer et al.

(10) Patent No.: US 6,504,757 B1
(45) Date of Patent: Jan. 7, 2003

(54) DOUBLE BOOSTING SCHEME FOR NAND TO IMPROVE PROGRAM INHIBIT CHARACTERISTICS

(75) Inventors: Shane C. Hollmer, San Jose, CA (US); Pau-Ling Chen, Saratoga, CA (US); Quang Binh, Mountain View, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 09/922,415

(22) Filed: Aug. 3, 2001

Related U.S. Application Data

(60) Provisional application No. 60/224,828, filed on Aug. 11, 2000.

(51) Int. Cl.[7] .............................................. G11C 16/04
(52) U.S. Cl. .............................. 365/185.18; 365/185.17
(58) Field of Search ........................ 365/185.18, 185.17, 365/185.01

(56) References Cited

U.S. PATENT DOCUMENTS 6,028,788 A * 2/2000 Choi et al. ............. 365/185.11
6,044,017 A * 3/2000 Lee et al. ............... 365/185.11

* cited by examiner

*Primary Examiner*—Hoai Ho
(74) *Attorney, Agent, or Firm*—Skjerven Morrill LLP

(57) ABSTRACT

A method for boosting potential in the channel of unselected memory cells on a selected bit-line. In this method, a first voltage is applied to all the word-lines of the memory cells in the string. A second voltage is then applied to word-lines adjacent the selected word lines to isolate the selected memory cell. Next, a programming voltage is applied to the selected word-line. In one embodiment, a time delay is applied between applying the second voltage and applying the third voltages to ensure isolation of the selected memory cell before applying the third voltage.

7 Claims, 3 Drawing Sheets

DOUBLE BOOSTING SCHEME FOR NAND TO IMPROVE PROGRAM INHIBIT CHARACTERISTICS

This application claims the benefit of Provisional Application No. 60/224,828, filed Aug. 11, 2000.

BACKGROUND OF THE INVENTION

1. Field of the Invention

This invention relates to semiconductor memories. More particularly, this invention relates to a boosting technique in the programming of NAND-type non-volatile semiconductor memories.

2. Discussion of the Related Art

Non-volatile semiconductor memories such as EPROMs, EEPROMs, and Flash memories are well known. In such memories, a threshold voltage Vt of a memory cell refers to the minimum programming voltage level that is required to write into the memory cell. When writing (programming) to a selected memory cell in a conventional non-volatile memory array, programming voltages are applied via a word-line (WL) connected to a control gate of the selected memory cell, via a bit-line (BL) connected to a drain of the selected memory cell, and via a select source line (SELS) coupled to a source of the selected memory cell. The combination of programming voltages changes the threshold voltage of the selected memory cell, typically by causing Fowler-Nordheim (F-N) tunneling or channel hot electron (CHE) injection which charges (or discharges) a floating gate in the selected memory cell.

FIG. 1 shows schematically a typical memory array 10 having external bit-lines $BL_M$ and word-lines $WL_N$. Memory 10 is made up of multiple "strings", each of which is a number of serially-connected floating gate transistors. For example, in FIG. 1, a string is shown including memory cells MC1 through MC16 coupled between select drain transistor SD and select source transistor SS. The channels of memory cells MC1 through MC16 form an internal bit-line IBL. Select drain transistor SD selects the string to program and select source transistor SS isolates the string to be programmed from other external bit-lines $BL_M$. The control gates of select source transistor SS and select drain transistor SD are coupled to select source line $SELS_N$ and select drain line $SELD_N$, respectively. Select drain line $SELD_N$ is coupled to an external supply voltage source, and select source line $SELS_N$ is typically coupled to an array voltage source $ARRVSS$ which is typically ground but can be an analog voltage depending on the operating mode. Each control gate of memory cells MC1 through MC16 is coupled to a respective word-line $WL_N1$ to $WL_N16$ which are in turn coupled to a decoder (not shown). (Although sixteen memory cells are shown for string 12, string 12 may contain other numbers of memory cells, for example, 4, 8 or 32 memory cells.)

Each memory cell MC1 through MC16 has a floating gate that is programmed and erased using, for example, Fowler-Nordheim tunneling. In Fowler-Nordheim tunneling programming, electrons are induced into the floating gate of a memory cell (e.g., memory cell MCB) by biasing the control gate of the memory cell to a relatively high voltage and grounding the body region of memory cell. For example, 20 volts is applied at word-line $WL_N2$ and the drain and the source of memory cell MCB are grounded to 0 volts. In Fowler-Nordheim tunneling erasing, the substrate of the selected memory cell, e.g., memory cell MCB, is biased at, e.g., 20 volts, while the control gate of memory cell MCB is grounded driving the electrons from the floating gate back into the substrate.

During programming of memory cell MCB, memory cell MCB is isolated from surrounding memory cells on the adjacent bit-lines and word-lines (e.g., memory cells MC2 and MCD on the adjacent bit-lines $BL_0$ and $BL_2$, respectively, and memory cells MCA and MCC on the adjacent word-lines $WL_N1$ and $WL_N3$, respectively). Typically, surrounding memory cells on the adjacent word-lines are inhibited by applying at their control gates an unselected word-line high state voltage $V_{PASS}$ (e.g., 10 volts), which provides a voltage difference between the control gate and the drain that is insufficient for a write operation. Regarding the surrounding memory cells on the adjacent bit-lines, the selected bit-line $BL_1$ is grounded and the unselected bit-lines $BL_0$ and $BL_2$ through $BL_M$ are biased at supply voltage Vcc. Select drain transistor SD for the selected block is similarly biased at supply voltage Vcc and al select source transistor SS is grounded.

A timing diagram for a conventional boosting technique is shown in FIG. 2. Internal bit-lines IBL are pre-charged to the supply voltage Vcc (e.g., 3 volts) minus the threshold voltage Vt (e.g., 1 volt). The unselected word-lines $WL_N1$ and $WL_N3$ through $WL_N16$ are pumped from source voltage Vcc to their high voltage $V_{PASS}$ (e.g., 8 to 10 volts). Concurrently, the selected word-line $WL_N2$ is pumped from voltage source Vcc to programming voltage $V_{PROG}$ (e.g., 16 to 19 volts). During ramping, the internal bit-line IBL1 through IBL15 are boosted to a voltage proportional to the coupling ratio times the voltage change in the word-line voltage. Since fifteen of the sixteen word-lines, i.e. word-lines $WL_N1$ and $WL_N3$ through $WL_N16$, go to their high voltage $V_{PASS}$ and only one word-line, i.e. $WL_N2$, goes to the programming voltage $V_{PROG}$, the internal bit-line IBL1 through IBL15 boosting potential is primarily a function of high voltage $V_{PASS}$. Experiments have shown that the extra boosting by the selected word-line $WL_N2$ pumping to programming voltage $V_{PROG}$ is shared by all 16 memory cells MC1 through MC16. Hence, the contribution to the boosting potential from the extra boosting is small. Since boosting is only needed in a narrow region around a memory cell to be programmed in order to isolate that memory cell, dividing the extra boosting potential among all memory cells is inefficient.

Another concern for a volatile memory is "program disturb" in an unselected memory cell, due to the high bit-line voltage and the word-line voltage in the selected memory cell. In program disturb, the threshold voltage of an unselected memory cell is changed by Fowler-Nordheim tunneling induced by the large voltage difference between the floating gate and the drain or the control gate of the unselected memory cell. Program disturb can accumulate through repeated programming of memory cells in the same word-line or bit-line, and in some instances may actually change the stored value in the unselected memory cell.

In NAND programming, program disturb can occur between a selected bit-line and an unselected word-line, or between a selected word-line and an unselected bit-line. The maximum boosting potential is limited by the coupling ratio and the maximum unselected word-line high state voltage $V_{PASS}$ that can be applied without disturbing the selected bit-line.

SUMMARY OF THE INVENTION

A method is provided for boosting the potential in the channel of a memory cell on a selected word-line without creating program disturb. Under this method, a first voltage is applied to the word-lines of all memory cells. Then, while maintaining the first voltage on a selected word-line, applying a second voltage to the word-lines adjacent the selected word line. Then, while maintaining the second voltage on adjacent word-lines, applying a third voltage to the selected word-line. In one embodiment, the second voltage is a ground voltage, the third voltage is a programming voltage, and the first voltage is a voltage intermediate between the programming voltage and the ground voltage. In one embodiment, a time delay is provided between the adjacent word-lines attaining the second voltage and the application of the third voltage on the selected word-line.

In one embodiment, the memory cells include floating gate transistors.

The present invention allows a selected memory cell to be isolated before application of the programming voltage. The isolation allows a more efficient boost in potential in the internal bit lines adjacent the selected memory cell.

The present invention may be better understood upon consideration of the detailed description below and the accompanying drawings.

BRIEF DESCRIPTION OF THE DRAWINGS

The use of the same reference symbols in different drawings indicates similar or identical items.

DETAILED DESCRIPTION OF THE PREFERRED EMBODIMENTS

Figure 1:
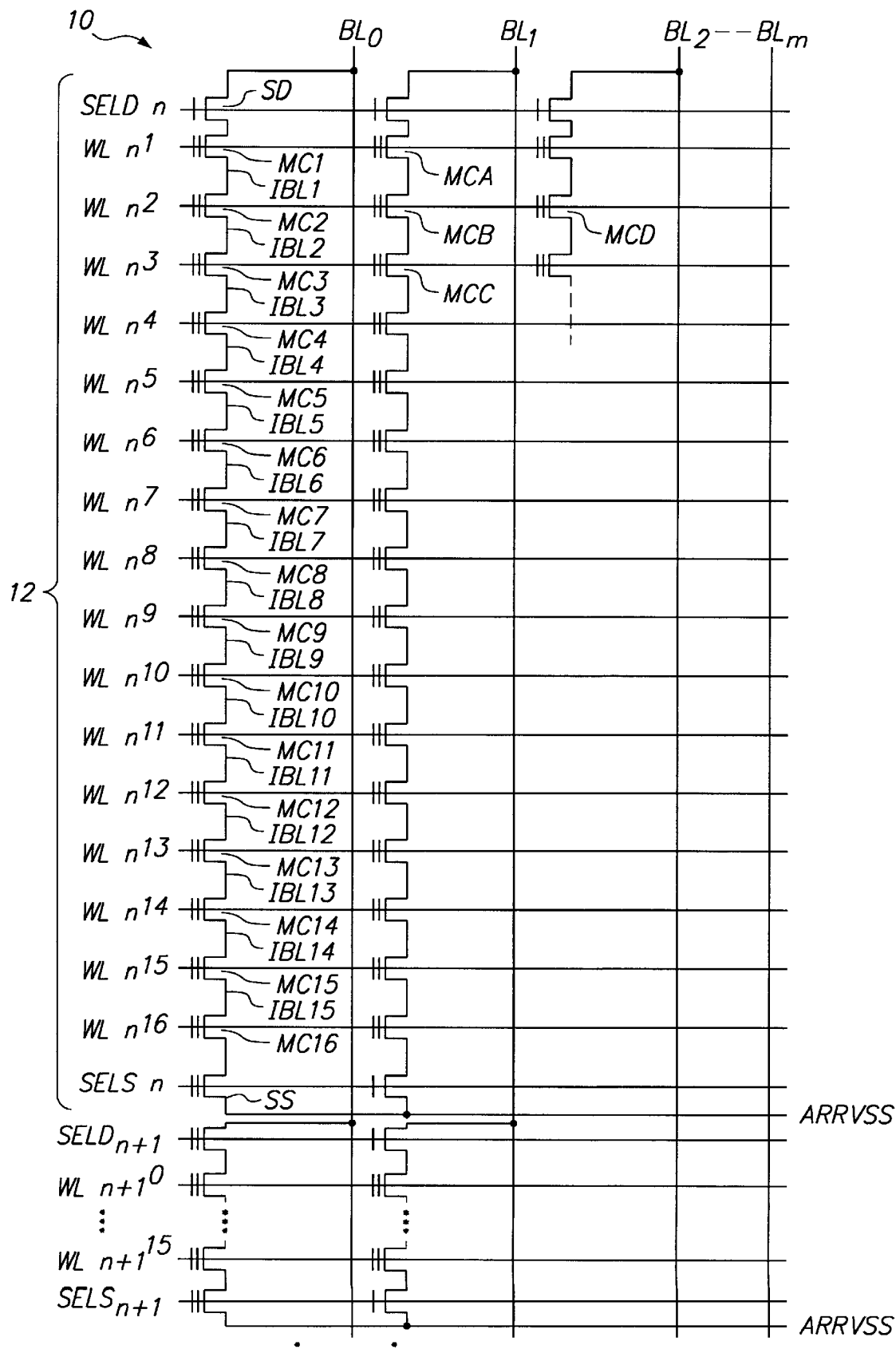
FIG. 1 (prior art) shows schematically a NAND type non-volatile memory array 10.
Figure 2:
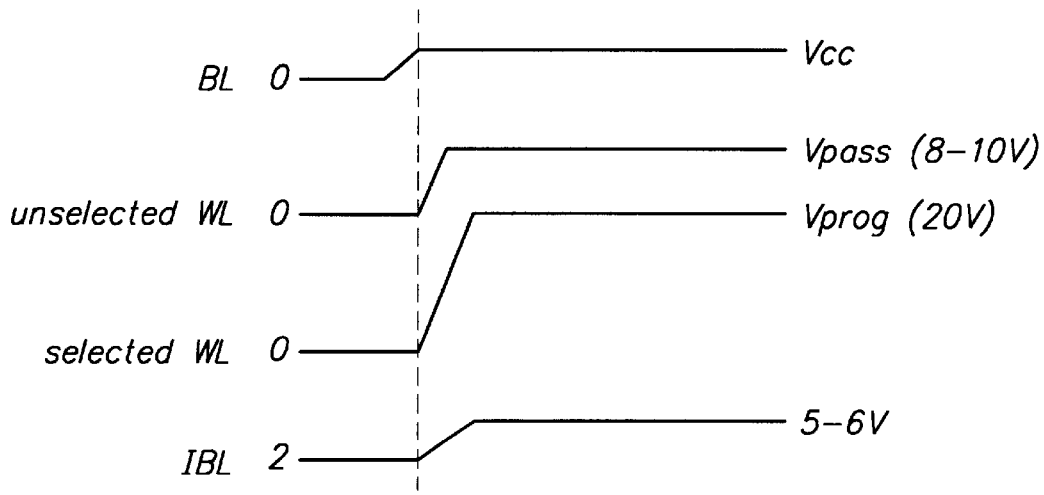
FIG. 2 (prior art) is a timing diagram of a conventional boosting technique in NAND type non-volatile memory programming.
Figure 3:
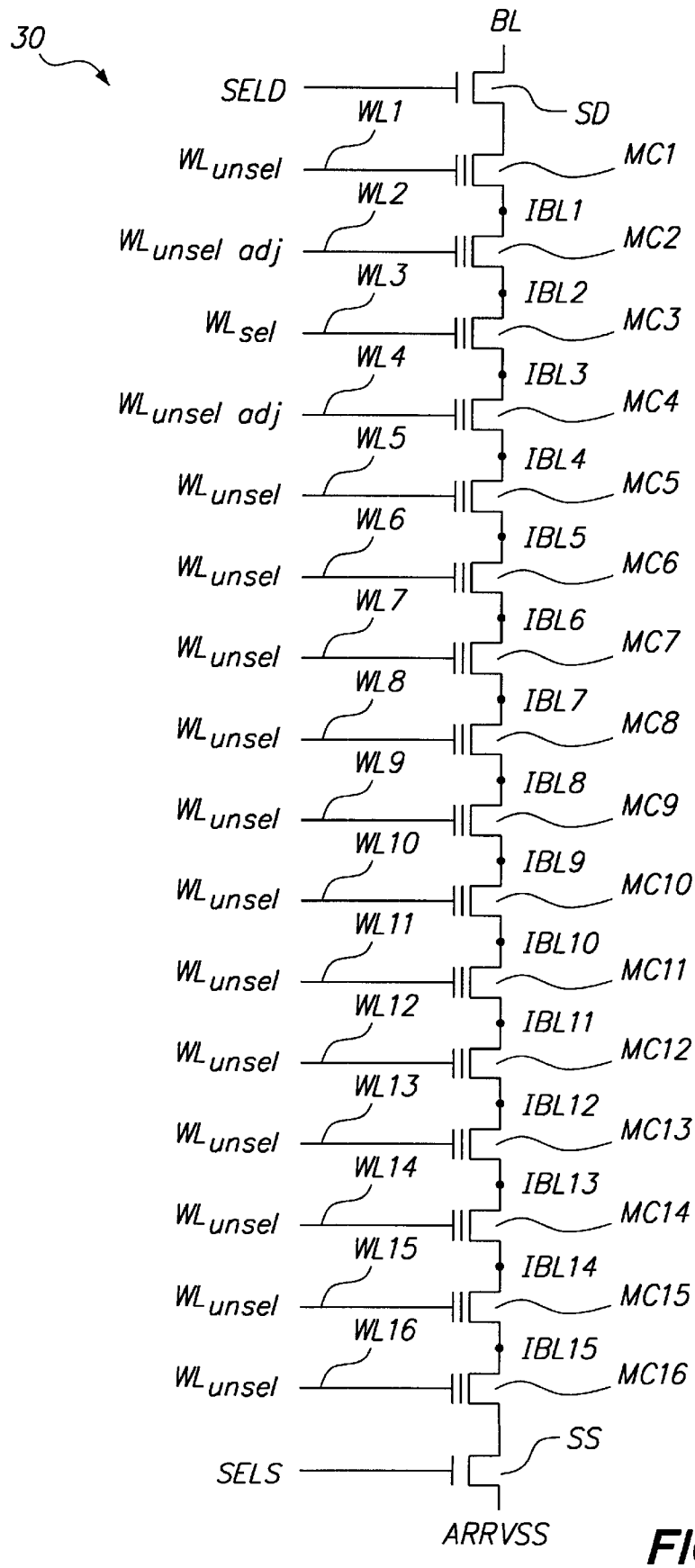
FIG. 3 shows schematically a NAND type "string" used in the detailed description to illustrate an embodiment of the present invention.

FIG. 3 is a schematic diagram of a non-volatile NAND string 30 similar to string 12 in memory 10 shown in FIG. 1. String 30 includes non-volatile memory cells MC1 to MC16 coupled in series between a select drain transistor SD and a select source transistor SS on bit-line BL. Each memory cell MC1 to MC16 is a floating gate transistor, but alternative memory cell architectures, including memory cells containing split gate transistors or a combination of memory transistors and select transistors may be used. For an analog/multi-level memory, each memory cell MC1 to MC16 has a continuous range of possible threshold voltages that correspond to a continuous range of stored analog/multi-level values. Alternatively, threshold voltage of the memory cell may indicate one of a set of possible discrete digital values if used in a digital multi-bit-per-cell memory.

The control gates of memory cells MC1 to MC16 are coupled respectively to word-lines WL1 to WL16, while the control gates of select source transistor SS and select drain transistor SD are coupled to select source line SELS and select drain line SELD, respectively. Select drain line SELD and select source line SELS are coupled to external supply voltages. The source side of select source transistor SS is coupled to array voltage source ARRVSS. The drain of the select drain transistor SD is coupled to a common bit-line BL. Each of word-lines WL1 to WL16 is coupled to a word-line decoder (not shown), which provides word-lines WL1 to WL16 various voltages as required for read, write, erase or verify operations. A bit-line decoder (not shown) is coupled to external bit-line BL and applies a bias voltage to external bit-line BL as required by the desired operation.

In one embodiment of the present invention, boosting involves two boost stages. Suppose memory cell MC3 is an unselected memory cell on a selected word-line and an unselected bit-line. In FIG. 3, to indicate this condition, the signal on word-line WL3 coupled to the control gate of memory cell MC3 is labeled "$WL_{SEL}$". Since only one memory cell in the selected string is selected at a time during programming, the remaining word-lines are unselected. The control gates of unselected memory cells MC2 and MC4 on either side of selected memory cell MC3 are coupled to word-lines WL2 and WL4, respectively. The signals on word-lines WL2 and WL4 are each labeled "$WL_{UNSEL\ ADJ}$", to denote their adjacency to word-line WL3. The signals on the remaining word-lines, i.e., WL1 and WL4 through WL16, are each labeled "$WL_{UNSEL}$".

Figure 4:
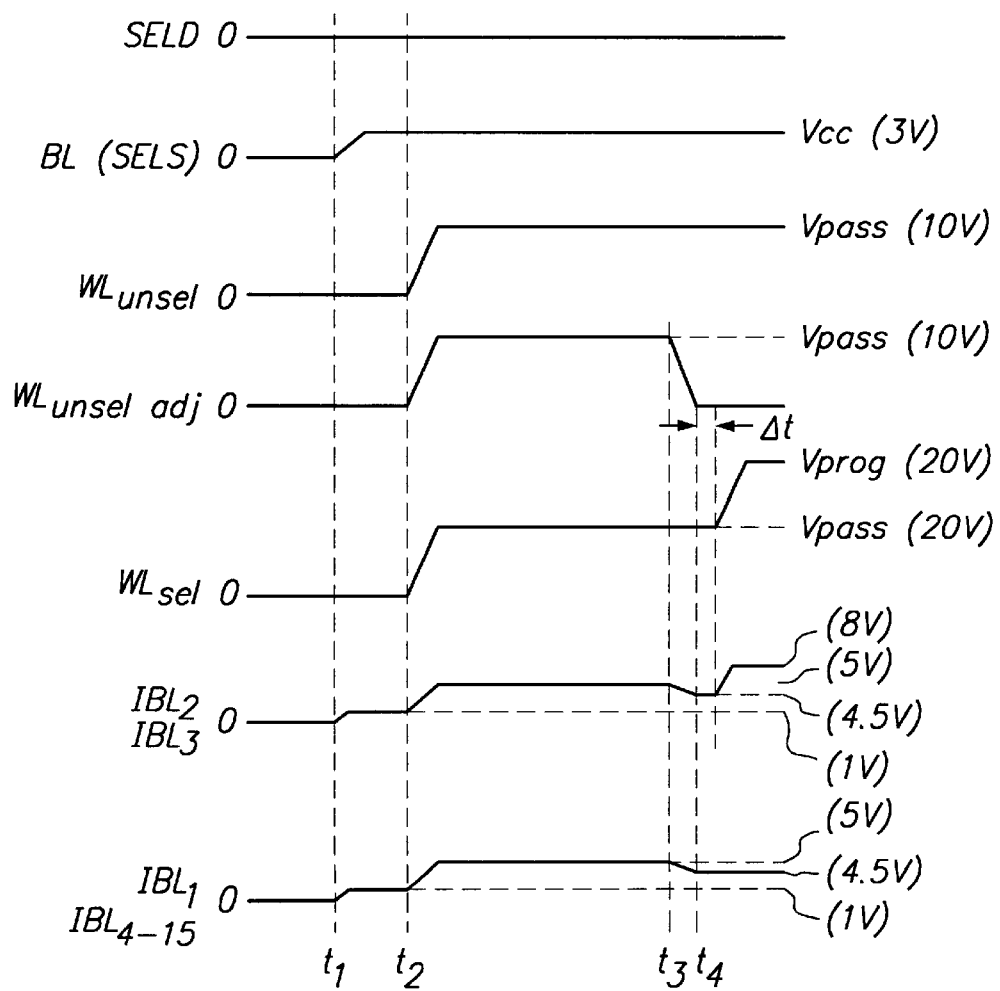
FIG. 4 is a timing diagram of the double boosting in accordance with one embodiment of the present invention.

FIG. 4 shows a timing diagram showing the voltage waveforms of selected signals in a boosting technique according to the present invention. First, immediately after time $t_1$, select source line SELS is brought to a supply voltage Vcc (e.g., 3 volts) and select drain line SELD is brought to a ground potential, thereby causing each internal bit-line IBL1 to IBL15 to reach a voltage of, for example, 1 volt. Immediately after time $t_2$, signals $WL_{SEL}$, $WL_{UNSEL}$ and $WL_{UNSEL\ ADJ}$ are all ramped up to the unselected word-line high state voltage $V_{PASS}$ (e.g., 10 volts) from either ground or supply voltage Vcc. Consequently, each internal bit-line IBL1 to IBL15 is boosted uniformly to an intermediate voltate (e.g., 5 volts).

Next, immediately after time $t_3$, instead of pumping the signal $WL_{SEL}$ of selected word-line WL3 to the programming voltage $V_{PROG}$, as in the prior art, signal $WL_{UNSEL\ ADJ}$ in each of word-lines WL2 and WL4 adjacent selected word-line WL3 is brought to ground potential. Since signal $WL_{UNSEL\ ADJ}$ is applied to control gate of only two of the sixteen word-lines, the decrease in voltage in WL2 and WL4 has little effect on the boosted potential in the internal bit lines. Thus, the boosted potential on internal bit-lines IBL1 to IBL15 decreases only slightly (e.g., to approximately 4.5 volts). By pulling signal $WL_{UNSEL\ ADJ}$ to ground, however, the selected word-line WL3 is isolated from other memory cells, effectively isolating the inhibited memory cells on the selected word-line WL3.

Finally, immediately after time $t_4$, signal $WL_{SEL}$ is pumped from the unselected word-line high state voltage $V_{PASS}$ to the programmed voltage $V_{PROG}$ (e.g., approximately 20 volts). It is noted that there is preferably a time delay $\Delta t$ after grounding signal $WL_{UNSEL\ ADJ}$ to ensure that the selected word-line WL3 has been isolated. This time delay $\Delta t$ is typically very short, such as 200 nanoseconds. Since the memory cells on selected word line WL3 are now isolated, the voltage change on the selected word-line $WL_{SEL}$ couples within a very small region, i.e., the voltage is shared equally between internal bit-lines IBL2 and IBL3 which now have a voltage of approximately 8 volts. The rest of the internal bit-lines, i.e., IBL1 and IBL4 through IBL15, remain unchanged at 4.5 volts because they are isolated from the selected word-line WL3.

Thus, according to the present invention, the boosted potential in the internal bit lines of the inhibited bits by 2 volts or 40%. The above technique allows the reduction of the unselected word-line high state voltage $V_{PASS}$ while still improving the inhibit-disturb characteristics. In other words, the technique allows a larger window within which to operate without increasing program disturb. This technique can be utilized in, for example, serial flash and MLC (multi-level cell) where the basic disturb characteristics are worse than the disturb characteristics for conventional NAND.

Although the present invention has been described with reference to specific embodiments, these embodiments are illustrative only and not limiting. Many variations and modification within the scope of the present invention are possible. The present invention is set forth in the following claims.

We claim:

1. A method for boosting an internal bit line potential in a memory string of series-connected memory cells, said method comprising:

applying a first voltage to control gates of said memory cells;

while maintaining said first voltage on a control gate of a selected one of said memory cells, applying a second voltage to control gates of memory cells adjacent said selected memory cell; and while maintaining said second voltage on said control gates of said adjacent memory cells, applying a third voltage to said control gate of said selected memory cell.

2. The method of claim 1, wherein said control gates of said memory cells are coupled to word lines of a memory array.

3. The method of claim 1, wherein said first voltage is between said second and third voltage.

4. The method of claim 3, wherein said second voltage is a programming voltage.

5. The method of claim 1, wherein a time delay is provided between said control gates of said adjacent memory cells attaining said second voltage and said applying of said third voltage on said control gate of said selected memory cell.

6. The method of claim 1, wherein said string of series-connected memory cell comprises NAND-type non-volatile semiconductor memory cells.

7. The method of claim 1, wherein each memory cell comprises a float gate transistor.

* * * * *